(12) United States Patent
Monda et al.

(10) Patent No.: US 9,451,709 B2
(45) Date of Patent: Sep. 20, 2016

(54) DAMAGE INDEX PREDICTING SYSTEM AND METHOD FOR PREDICTING DAMAGE-RELATED INDEX

(75) Inventors: Tomoko Monda, Yokohama (JP); Minoru Mukai, Shinagawa-ku (JP); Kenji Hirohata, Koto-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 12/505,758

(22) Filed: Jul. 20, 2009

(65) Prior Publication Data

US 2010/0070204 A1   Mar. 18, 2010

(30) Foreign Application Priority Data

Sep. 17, 2008   (JP) ................ P2008-237935

(51) Int. Cl.
*G01R 31/02* (2006.01)
*H05K 3/34* (2006.01)
*H05K 1/02* (2006.01)

(52) U.S. Cl.
CPC ........ *H05K 3/3436* (2013.01); *H05K 1/0268* (2013.01); *H05K 2201/10204* (2013.01); *H05K 2201/10522* (2013.01); *H05K 2201/10545* (2013.01); *H05K 2203/163* (2013.01); *Y02P 70/613* (2015.11)

(58) Field of Classification Search
CPC ............ G01R 31/048; H05K 1/0268; H05K 2201/10204; H05K 2203/162
USPC .................................... 702/35, 184
See application file for complete search history.

(56) References Cited

U.S. PATENT DOCUMENTS

| 5,638,597 A | * | 6/1997 | Cutting et al. ................. 29/830 |
| 5,789,680 A | * | 8/1998 | Fujimoto ......................... 73/799 |
| 6,106,661 A | * | 8/2000 | Raeder et al. ........... 156/345.12 |
| 6,260,998 B1 | * | 7/2001 | Garfinkel et al. .............. 374/57 |

(Continued)

FOREIGN PATENT DOCUMENTS

| JP | 2000-0022024 | 1/2000 |
| JP | 3265197 B2 | 12/2001 |
| JP | 2010-73795 A | 4/2010 |

OTHER PUBLICATIONS

J.S. Corbin, Finite element analysis for Solder Ball Connect (SBC) structural design optimization, IBM J. Res. Develop. vol. 37 No. 5 Sep. 1993. pp. 585-596.*

(Continued)

*Primary Examiner* — Gregory J Toatley
*Assistant Examiner* — Michael Dalbo
(74) *Attorney, Agent, or Firm* — Finnegan, Henderson, Farabrow, Garrett & Dunner LLP

(57) ABSTRACT

A damage index predicting system is for predicting a damage-related index of solder joints of an electronic device having the solder joints that electrically connect an electronic component to a mounting circuit board and one or more detection solder joints that are designed so as to have a shorter life than the solder joints. The system includes: a database configured to store a fracture relationship between the detection solder joints and the solder joints; a fracture detector configured to detect fracture of the detection solder joints; and a processor configured to calculate a prediction value of the damage-related index of the solder joints based on information relating to the fracture of the detection solder joints obtained by the fracture detector and the fracture relationship stored in the database.

17 Claims, 15 Drawing Sheets

(56) References Cited

U.S. PATENT DOCUMENTS

| | | | |
|---|---|---|---|
| 6,452,502 B1* | 9/2002 | Dishongh et al. | 340/653 |
| 7,474,989 B1* | 1/2009 | Wilcoxon | 702/185 |
| 7,478,741 B1* | 1/2009 | Newman | 228/103 |
| 2002/0121141 A1* | 9/2002 | Kiuchi et al. | 73/593 |
| 2002/0140108 A1* | 10/2002 | Johnson | 257/778 |
| 2004/0158450 A1* | 8/2004 | Nakadate et al. | 703/22 |
| 2005/0212549 A1* | 9/2005 | Matsubara et al. | 324/772 |
| 2006/0170113 A1* | 8/2006 | Tanaka et al. | 257/778 |
| 2006/0293866 A1* | 12/2006 | Utaka et al. | 702/133 |
| 2007/0230535 A1* | 10/2007 | Atwood et al. | 374/1 |
| 2007/0252612 A1* | 11/2007 | Sylvester | 324/765 |
| 2008/0310130 A1 | 12/2008 | Monda et al. | |
| 2009/0058435 A1* | 3/2009 | Nakamura | 324/719 |
| 2009/0190317 A1 | 7/2009 | Monda et al. | |
| 2010/0070204 A1 | 3/2010 | Monda et al. | |
| 2010/0082913 A1 | 4/2010 | Mukai et al. | |

OTHER PUBLICATIONS

J.S Corbin, Finite element analysis for Solder Ball Connect (SBC) structural design optimization, IBM J. Res. Develop. vol. 37 No. 5 Sep. 1993. pp. 585-596.*

Office Action from corresponding Japanese Application No. 2011-044015 dated Sep. 18, 2012 with English translation.

Japanese Office Action dated Mar. 24, 2015 from corresponding JP Application No. 2014-131457, 7 pages.

Decision of Refusal issued by the Japanese Patent Office on Jan. 5, 2016, in counterpart Japanese Patent Application No. 2014-131457.

* cited by examiner

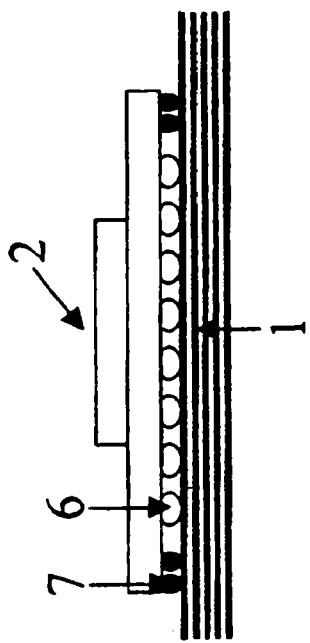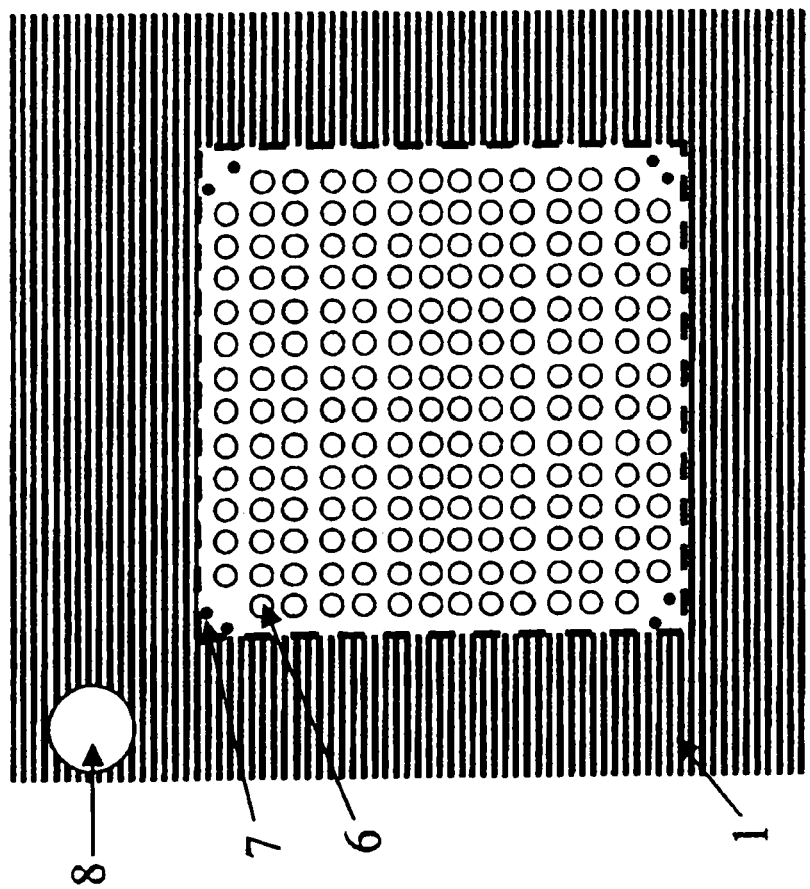

__DAMAGE INDEX PREDICTING SYSTEM AND METHOD FOR PREDICTING DAMAGE-RELATED INDEX__

CROSS-REFERENCE TO THE RELATED APPLICATION(S)

The present disclosure relates to the subject matters contained in Japanese Patent Application No. 2008-237935 filed on Sep. 17, 2008, which are incorporated herein by reference in its entirety.

FIELD

The present invention relates to a damage index predicting system for predicting damage index of an electronic device and a method therefor.

BACKGROUND

With the increase in the functionality and the number of available functions in equipments incorporating semiconductor devices, the integration density and the scale of semiconductor chips are increasing and the number of electric solder joints (generally solder joints) that connect a semiconductor package incorporating a semiconductor chip to a circuit board is increasing to a large extent. Accordingly, the solder joints of a semiconductor package become more apt to be deteriorated by thermal-fatigue (thermal fatigue fracture) since the solder joints receive thermal stress repeatedly.

To prevent thermal fatigue fracture of solder joints, a method for detecting upcoming thermal fatigue fracture of solder joints has been proposed (refer to JP-B2-3265197, for example). In this method, sensor bumps that electrically connect the semiconductor package side to the circuit board side are provided separately from original bumps for electrical connection. An electrical resistance value of a connection path including the sensor bumps are detected automatically. It is determined that the solder joints are approaching thermal fatigue fracture when a detected electrical resistance value has exceeded a given level.

The above-described thermal fatigue fracture detecting method which is proposed by the publication JP-B2-3265197 has a problem that a remaining life of solder joints of a semiconductor package cannot be determined though their upcoming thermal fatigue fracture can be detected.

Furthermore, where damage prediction is made before use of an electronic device or damage prediction is made based on a parameter measured during use of an electronic device, it should be taken into consideration that differences exist between individual electronic device and individual components and members such as functional components mounted and solder joints. In addition, the fatigue characteristic of the solder joint has a variation. Therefore, actual damage values of the solder joints have a large variation and may be much different from a damage prediction value.

SUMMARY

According to an aspect of the invention, there is provided a damage index predicting system for predicting a damage-related index of solder joints of an electronic device having the solder joints that electrically connect an electronic component to a mounting circuit board and one or more detection solder joints that are designed so as to have a shorter life than the solder joints, the system including: a database configured to store a fracture relationship between the detection solder joints and the solder joints; a fracture detector configured to detect fracture of the detection solder joints; and a processor configured to calculate a prediction value of the damage-related index of the solder joints based on information relating to the fracture of the detection solder joints obtained by the fracture detector and the fracture relationship stored in the database.

According to another aspect of the invention, there is provided a damage index predicting system for predicting a damage-related index of solder joints of an electronic device having the solder joints that electrically connect an electronic component to a mounting circuit board and one or more detection solder joints that are designed so as to have a shorter life than the solder joints, the system including: a fracture detector configured to detect fracture of the detection solder joints; a state parameter database configured to store data of a state parameter of the solder joints and the detection solder joints; a fatigue characteristic database configured to store fatigue characteristic data indicating a relationship between the state parameter of the solder joints and a damage-related index of the solder joints; a correction processor configured to receive fracture detection information of the detection solder joints from the fracture detector and to correct the fatigue characteristic data of the fatigue characteristic database based on a value of the damage-related index of the detection solder joints and a value of the state parameter of the detection solder joints; and a processor configured to receive the data of the state parameter of the solder joints and the detection solder joints and the corrected fatigue characteristic data of the fatigue characteristic database and to calculate a prediction value of the damage-related index of the solder joints.

According to another aspect of the invention, there is provided a method for predicting a damage-related index of solder joints of an electronic device having the solder joints that electrically connect an electronic component to a mounting circuit board and one or more of detection solder joints that are designed so as to have a shorter life than the solder joints, the method including: preparing a relationship between the damage-related index of the solder joints and the damage-related index of the detection solder joints; detecting fracture of the detection solder joints; and calculating a prediction value of the damage-related index of the solder joints based on the damage-related index of the detection solder joints obtained by the fracture detector and the fracture relationship stored in the database.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

FIG. 13A is a sectional view showing an electronic component and its neighborhood according to an eighth modification, and FIG. 13B is a plan view showing an arrangement of solder joints of the electronic component and detection solder joints.

DETAILED DESCRIPTION OF THE EMBODIMENTS

Figure 1:
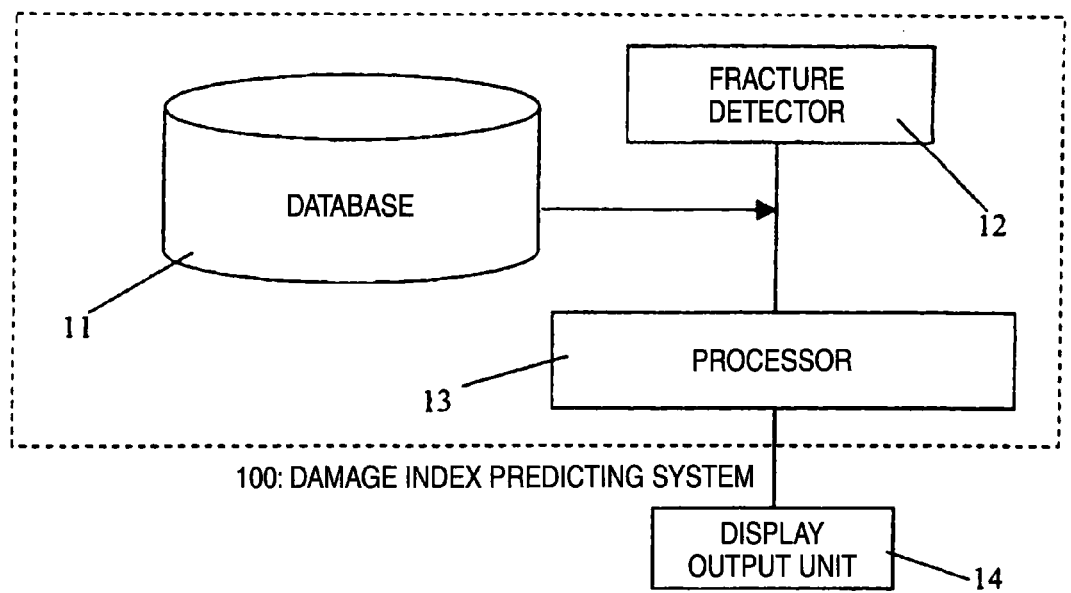
FIG. 1 is a block diagram showing a general configuration of a damage index predicting system according to a first embodiment of the present invention.

Hereinafter, embodiments of the invention will be described with reference to the drawings. In the following description, the same or similar components will be denoted by the same reference numerals, and the duplicate description thereof will be omitted.

First Embodiment

FIG. 1 is a block diagram showing a general configuration of a damage index predicting system according to a first embodiment of the invention which uses damage information of solder joints of an electronic component mounted on a circuit board. The damage index predicting system can either be incorporated in an electronic device or be provided outside an electronic device and connected to the electronic device.

As shown in FIG. 1, the damage index predicting system 100 is equipped with a database 11 of a damage relationship between solder joints and detection solder joints, a fracture detector 12 for detecting fracture of the detection solder joints, a processor 13 for calculating a damage-related index of the solder joints, and a display output unit 14. The display output unit 14 may be omitted.

For example, an accelerated test such as a temperature cycle test or a phenomenological analysis such as a stress analysis is performed, and a damage relationship between the solder joints of the electronic component and the detection solder joints (described later) is calculated and a result is stored in the database 11 in advance.

For example, the relationship (damage relationship) between the damage of the solder joints of the electronic component and the damage of the detection solder joints is represented by a function involving indices relating to the two kinds of damage, and makes it possible to calculate a damage-related index of the solder joints of the electronic component from a damage-related index of a detection solder joint.

The damage-related index will be described. In general, an electronic device is powered on every time it is used and is powered off every time its use is finished. Thermal stress is imposed on functional components incorporated in the electronic device as it is powered on and off repeatedly. When an electronic device is used in a moving vehicle or is dropped, vibration is imposed on electronic components provided inside the electronic device. Such thermal stress and vibration which are imposed on the electronic components affect their damage or life. An index representing such damage or a life is a damage-related index. Example damage-related indices are a fracture life, a damage value, a function using the fracture life, and a function using the damage value.

The fracture life indicates a time span to fracture and is represented by the number of cycles to fracture, a fracture time, or the like.

The damage value can be defined in the following manner. The damage value that occurs when a repetitive load is imposed in one cycle is given by the reciprocal of the life cycle number that is obtained when the same repetitive load is applied repeatedly. The damage value that occurs when a load is imposed repeatedly is an accumulation of damage values occurring in respective cycles. The accumulation of damage values that has reached "1" means that the solder joint has been fractured.

Assume that the damage-related index is the fracture life and the relationship between the damage-related indices is the life ratio, and that the detection solder joints were designed and manufactured in such a manner that the fracture life, for temperature variation etc., of the detection solder joints is set to a half of that of the solder joints of an electronic component. If the life ratio is defined as the ratio of a predicted life of the detection solder joints to a predicted life being set to "1" of the solder joints of the electronic component, the life ratio of the detection solder joints is equal to "0.5." In this case, if the detection solder joints survive 2,000 times of repetitive use, it can be predicted that the solder joints of the electronic component will survive 4,000 times of repetitive use. It is not always the case that a life is predicted as the number of repetition cycles of temperature variation. That is, a life can be predicted as a time to the end of the life of the electronic device in the case where the fracture life of the detection solder joints is represented by the use time.

The fracture detector 12 serves to detect fracture of the detection solder joints. A detection method will be described later. The fracture detector 12 can be an electric circuit, for example.

The detection solder joints are solder joints having the same structure as the solder joints of the electronic component. And the detection solder joints may be part of the solder joints of the electronic component in a physical sense though no electrical signals for functioning of the electronic component pass through the detection solder joints. The detection solder joints are made of a solder material, for example.

First, while receiving information of the detection solder joints from the fracture detector 12, the processor 13 for calculating a damage-related index of the solder joint retrieves the stored damage relationship from the database 11 and calculates a prediction value of the damage-related index, for example, a prediction value of the number of cycles to fracture, of the solder joints of the electronic component. The processor 13 may be a CPU, for example. The calculated prediction value of the damage-related index of the solder joints of the electronic component may be displayed on the display output unit 14.

Since individual electronic device are different in use environment and have variations among them, a uniform prediction made before use is not sufficient in terms of reliability. A more appropriate damage index prediction can be performed by retrieving to consideration a use history of the apparatus and differences between individual apparatus.

The display output unit 14 serves to present information relating to a life to an operator of the electronic device. It is preferable to use a display of the electronic device also as the display output unit 14. For example, a message "The allowable number of times of repetitive use is 4,000, and the current number of times of repetitive use is 2,000." is displayed. However, the display output unit 14 may be omitted.

Figure 2:
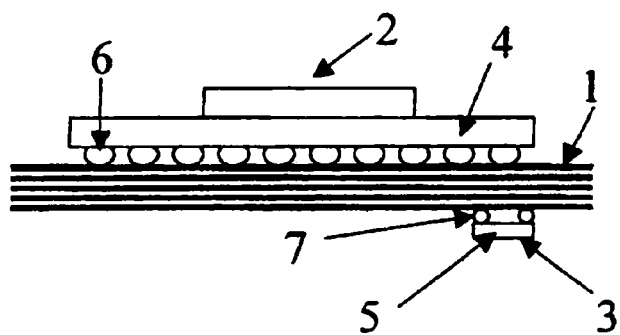
FIG. 2 is a sectional view of an electronic component and its neighborhood according to the first embodiment of the invention.

Next, a configuration of detection solder joints will be described. FIG. 2 is a sectional view of an electronic component and its neighborhood according to the first embodiment of the invention. As shown in FIG. 2, the electronic component 2 is mounted on a circuit board 1 and a detection device 3 is mounted on the back side of the electronic component 2 with the circuit board 1 interposed in between. The detection device 3 is electrically connected to the circuit board 1 via detection solder joints 7. The detection solder joints 7 are designed so as to have a shorter life than solder joints 6 of the electronic component 2. For example, when the joining potions 6 has such a life as to survive 10,000 times of repetitive use, the detection solder joints 7 are designed so as to survive 5,000 times of repetitive use, that is, to have a life that is a half of the life of the joining potions 6.

There are various designing methods that cause a difference in life. For example, the detection device 3 is disposed on the back surface of the circuit board 1 around a position directly below a corner of the electronic component 2 where the curvature of the circuit board 1 varies characteristically or around a position directly below a chip corner in the case where the electronic component 2 is a semiconductor package. With this arrangement, the load on the detection solder joints 7 is heavier than that on the solder joints 6 and hence the life of the detection solder joints 7 becomes shorter.

The circuit board 1, a package substrate 4 of the electronic component 2, and a detection device substrate(s) 5 are made of materials having different linear expansion coefficients in such a manner that the linear expansion coefficient increase in order of the circuit board 1, the package substrate 4, and the detection device substrate 5 and that the difference between the linear expansion coefficients of the detection device substrate 5 and the circuit board 1 is larger than the difference between the linear expansion coefficients of the package substrate 4 and the circuit board 1. For example, the circuit board 1 and the package substrate 4 are made of resins and the detection device substrate 5 is made of ceramics. As a result, the life of the detection solder joints 7 can be made shorter than that of the solder joints 6 of the electronic component 2 because higher thermal stress acts on the solder joints as the difference in linear expansion coefficient increases as long as the solder joints have the same shape and boundary conditions. Furthermore, the lives of the sets of detection solder joints 7 can be set stepwise by forming the detection devices substrates 5 with materials having different linear expansion coefficients; the detection solder joints 7 corresponding to the detection device substrate 5 whose linear expansion coefficient is more different from the linear expansion coefficient of the circuit board 1 is given a shorter life.

Next, a description will be made of the detection of fracture of a detection solder joint 7, which is indispensable for recognition of the life of the detection solder joints 7. For example, the embodiment uses a variation in electrical property. If electrical resistance is used as the electrical property, a detection "a detection solder joint has been fractured" can be made when the resistance has become infinite (loss of electrical continuity) or has varied remarkably from a previous value. Another example of the electrical property is capacitance. Fracture of a detection solder joint 7 can be detected by using a variation in capacitance.

In the embodiment, sets of detection solder joints 7 may be disposed at plural locations. This enables more reliable fracture index prediction than in the case where a set of detection solder joints 7 is disposed at a single location.

Figure 3:
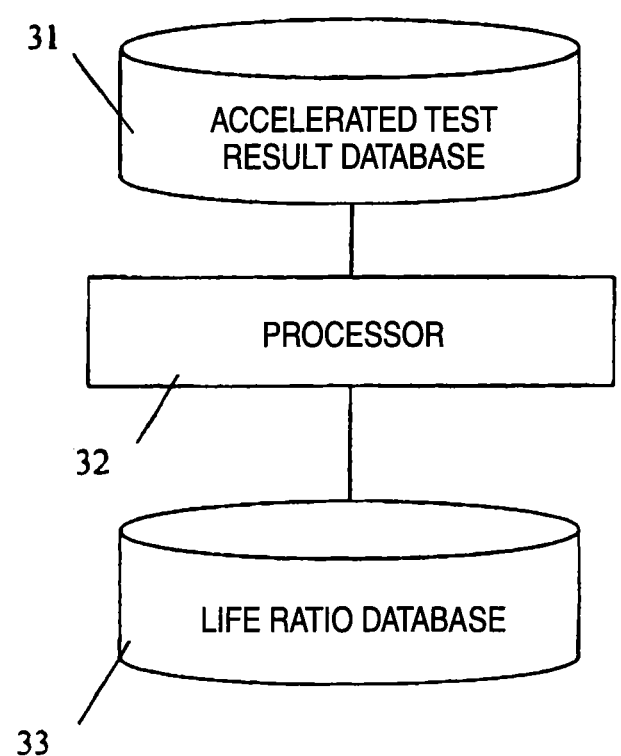
FIG. 3 is a block diagram outlining a configuration for constructing a life ratio database.

FIG. 3 is a block diagram outlining a configuration for constructing a database of the life ratio between the detection solder joints 7 and the solder joints 6 by an accelerated test such as a temperature cycle test in the case where the damage-related index is the fracture life and the damage relationship is the life ratio. It is assumed that the life ratio is the ratio of the predicted life of the detection solder joints 7 to the predicted life (assumed to be "1") of the solder joints 6 of the electronic component 2. There are provided an acceleration test result database 31, a processor 32 for calculating a life ratio between each detection solder joint 7 to a life of the solder joints 6, and a database 33 of the life ratio between the detection solder joints 7 and the solder joints 6. An accelerated test such as a temperature cycle test is performed and fracture lives of the solder joints 6 and the detection solder joints 7 are accumulated in the accelerated test result database 31 in advance. As mentioned above, the fracture life is the test time, the number of cycles, or the like. The processor 32 calculates life ratios between the detection solder joints 7 and the solder joints 6, which are accumulated in the life ratio database 33.

Figure 4:
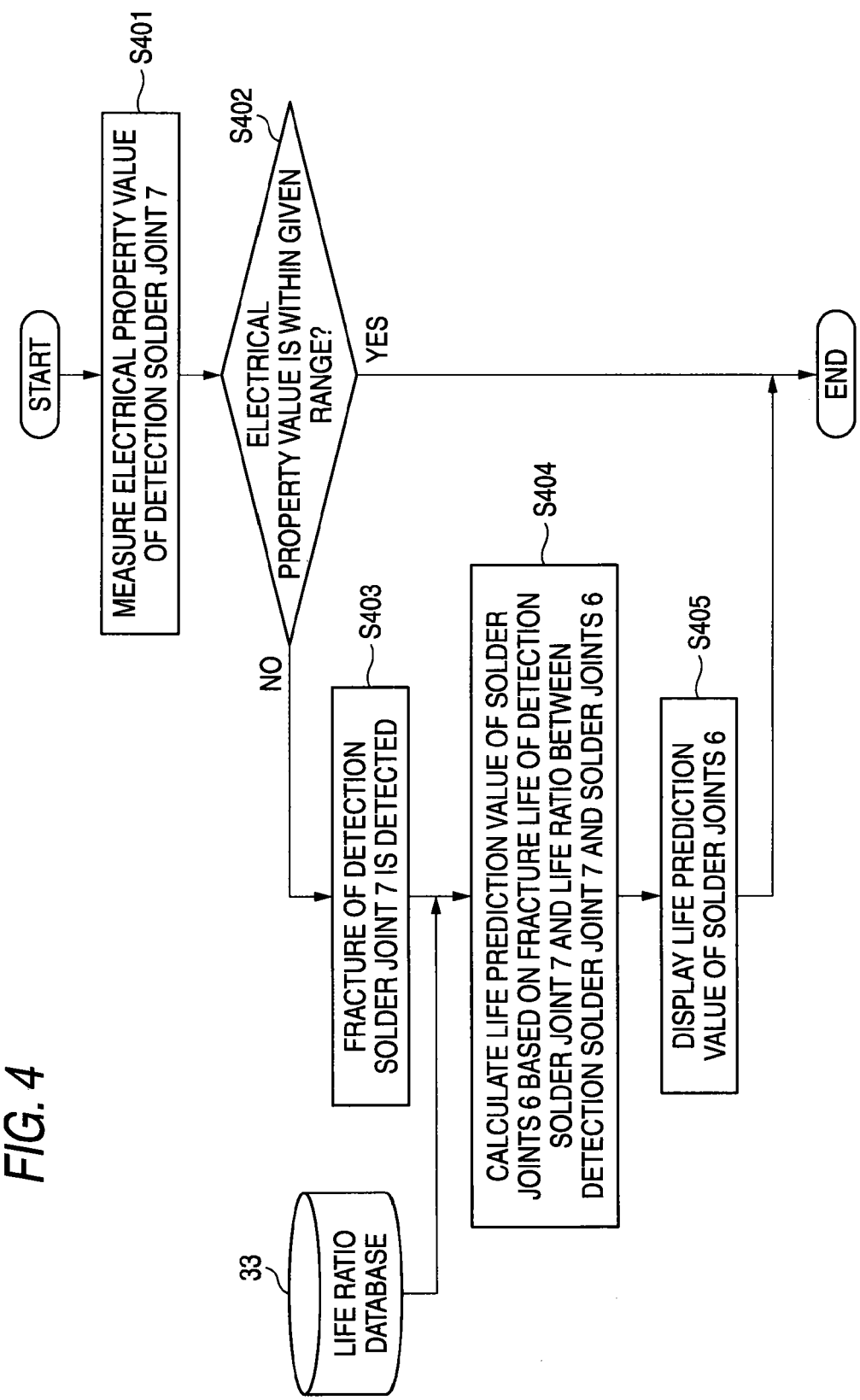
FIG. 4 is a flowchart of a method for predicting a damage index of solder joints of the electronic component.

FIG. 4 is a flowchart of a method for predicting a damage index of the solder joints 6 of the electronic component 2 in the case where only one detection solder joint 7 is provided. As shown in FIG. 4, at step S401, an electrical property value of the detection solder joint 7 is measured. If the measured electrical property value of the detection solder joint 7 is out of a given range (S402: no), it is determined that the detection solder joint 7 has been fractured. If fracture of the detection solder joints 7 is detected at step S403, at step S404 a life prediction value of the solder joints 6 is calculated based on an actual fracture life of the detection solder joint 7 and the data of the life ratio between the detection solder joint 7 and the solder joints 6 (taken in from the pre-build database 33). At step S405, the calculated life prediction value of the solder joints 6 of the electronic component 2 is output when necessary.

The system may be configured to operate in various manners; for example, the system may be configured to operate in full-time while the system is in service, to operate periodically for every given number of uses (e.g., when the apparatus is booted), or to operate on a regular basis (e.g., once per week).

According to the embodiment, since a life of the solder joints 6 of the electronic component 2 is predicted based on a fracture life of the detection solder joint 6 during use of the electronic device, highly accurate damage index prediction is enabled in which an environment and a use situation of the apparatus and differences between individual apparatus are taken into consideration.

Figure 5:
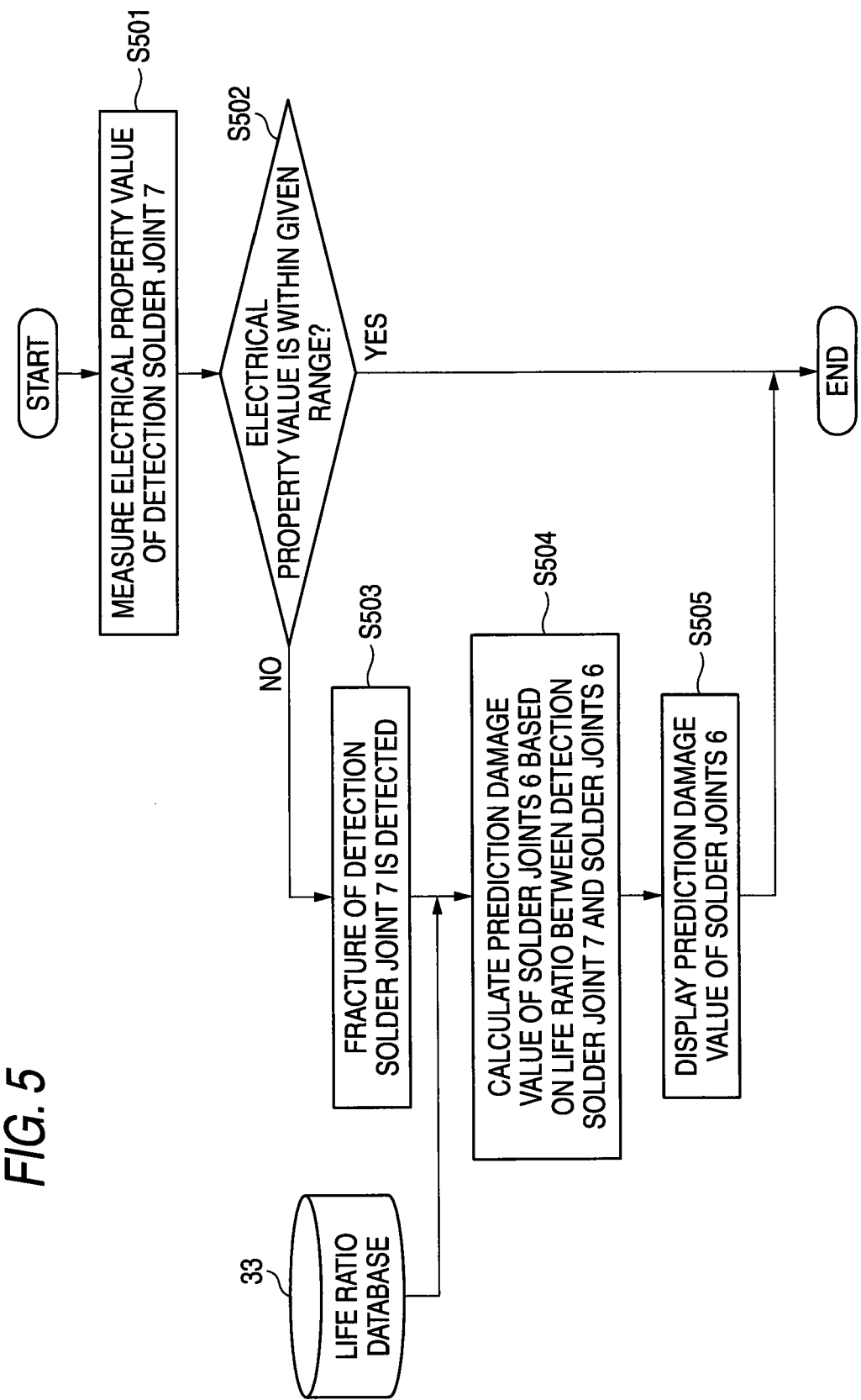
FIG. 5 is a flowchart of a method for predicting a damage index of solder joints of an electronic component according to a first modification.

Next, a first modification of the first embodiment will be described. FIG. 5 is a flowchart of a method for predicting a damage index of the solder joints 6 of the electronic component 2 according to the first modification. As seen from FIG. 5, the first modification is the same as the first embodiment except that in the first modification a prediction value of the damage-related index of the solder joints 6 of the electronic component 2 is calculated when the detection solder joint 7 is fractured. In the first modification, assume that the damage-related index of the solder joints 6 of the electronic component 2 is the damage value and the damage relationship between the detection solder joint 7 and the solder joints 6 is the life ratio. In the first modification, at step S501, an electrical property value of the detection solder joint 7 is measured. If the measured electrical property value of the detection solder joint 7 is out of a given range (S502: no), it is determined that the detection solder joint 7 has been fractured. If fracture of the detection solder joint 7 is detected at step S503, at step S504 a damage value of the solder joints 6 of the electronic component 2 is calculated by retrieving the data of the life ratio between the detection solder joint 7 and the solder joints 6 from the database 33. At step S505, the calculated damage value is output as a prediction damage value of the solder joints 6 of the electronic component 2 when necessary. If the life ratio between the detection solder joint 7 and the solder joints 6 is 0.5, it can be expected that the damage value of the solder joints 6 is 0.5 at the time point of the fracture of the detection solder joint 7. Where the display output unit 14 is provided, for example, a massage "At present, 50% of the usable time has elapsed." can be displayed.

In the first modification, at a time point when the detection solder joint 7 is fractured, a prediction damage value of the solder joints 6 of the electronic component 2 is calculated based on information relating to the fracture of the detection solder joint 7 and a life ratio which is a damage relationship between the solder joints 6 of the electronic component 2 and the detection solder joint 7 without using a fracture life of the detection solder joint 7. Therefore, it is not necessary to measure the number of cycles or a use time of the detection solder joint 7. As a result, damage index prediction can be performed without a device for measuring the number of cycles or a use time or a device for storing the number of cycles or a use time. Although in the first modification only one detection solder joint 7 is provided, plural detection solder joints 7 may be provided, in which case more accurate life prediction is enabled.

Figure 6:
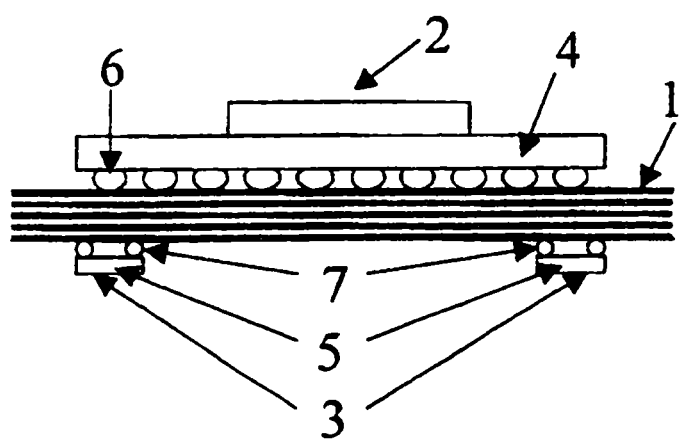
FIG. 6 is a sectional view of an electronic component and its neighborhood according to a second modification.

Next, a second modification of the first embodiment will be described. FIG. 6 is a sectional view of an electronic component and its neighborhood according to the second modification. The second modification is the same in configuration as the first embodiment except that plural detection solder joints 7 are provided. Each detection solder joint 7 is designed so as to have a shorter life than the solder joints 6 of the electronic component 2.

Figure 7:
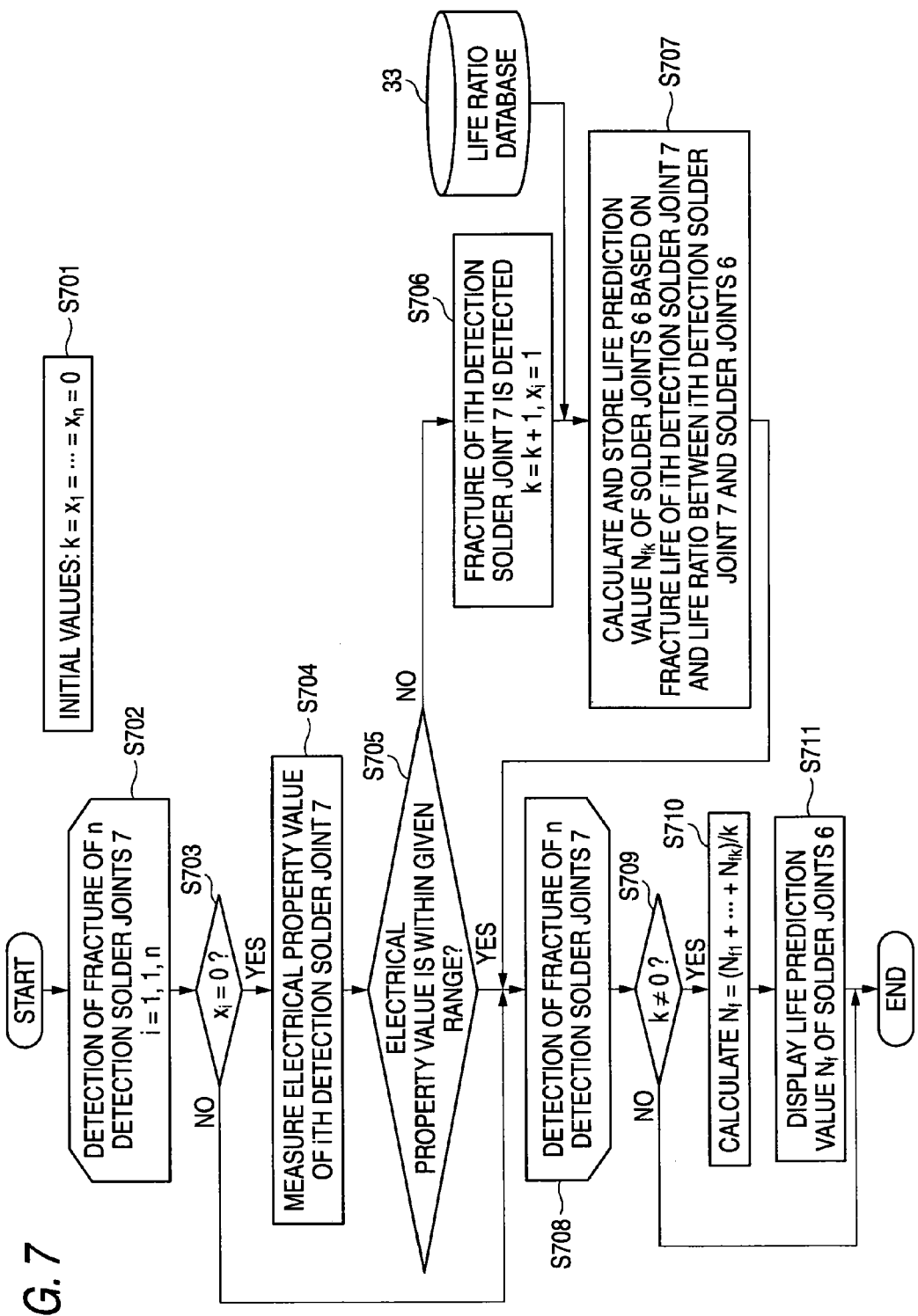
FIG. 7 is a flowchart of a method for predicting a damage index of solder joints of the electronic component according to the second modification.

FIG. 7 is a flowchart of a method for predicting a damage index of the solder joints 6. As seen from FIG. 7, the damage index predicting method according to the second modification is the same as that according to the first embodiment except that n-pieces of the detection solder joints 7 are provided and the prediction value of the damage-related index of the solder joints 6 is corrected every time a detection solder joint 7 is fractured. Parameter x represents the state of each detection solder joint 7, and takes a value "0" if the detection solder joints 7 is normal and a value "1" if detection solder joints 7 is fractured. Parameter k represents a place of a detection solder joint 7 concerned in a succession of fractured detection solder joints 7. At step S701, parameter k and parameters x of all detection solder joints 7 are set to initial values "0." The value of parameter k is increased by 1 every time a detection solder joint 7 is fractured and the value of parameter x of the fracture-detected detection solder joint 7 is set to "1" (step S706). At steps S702-S708, electrical property values of the n respective detection solder joints 7 are measured. It is determined at step S703 whether the detection solder joint 7 concerned is not fractured, and at step S704 an electrical property value of the detection solder joint 7 is measured if it is not fractured. If the measured electrical property value of the detection solder joint 7 is out of a given range (S705: no), it is determined that the detection solder joint 7 is fractured. If fracture of the detection solder joint 7 is detected at step S706, at step S707 a life of the solder joints 6 is predicted based on a fracture life of the fracture-detected detection solder joint 7 and a life ratio between the fractured detection solder joint 7 and the solder joints 6 (taken in from the database 33). The predicted life is represented by $N_{fk}$. At step S710, a statistical value (in the second modification, an average) of $N_{f1}$ to $N_{fk}$ is calculated and employed as a life prediction value $N_f$. At step S711, the life prediction value $N_f$ is displayed as a corrected life prediction value. If no detection solder joint 7 has been fractured (S709: no), no life prediction value is displayed. From this time onward, every time a new detection solder joint 7 is fractured, the life prediction value $N_f$ of the solder joints 6 is corrected by calculating an average of life prediction values of the solder joints 6 that are calculated from fracture lives of the detection solder joints 7 fractured so far and life ratios between the fractured detection solder joints 7 and the solder joints 6.

Although in the second modification the fracture life is used as the damage-related index, the damage value, which was used in the first modification, may be used instead.

The second modification enables even higher accuracy prediction because the damage index prediction value is corrected stepwise as fracture of plural detection solder joints 7 is detected one by one.

Figure 8:
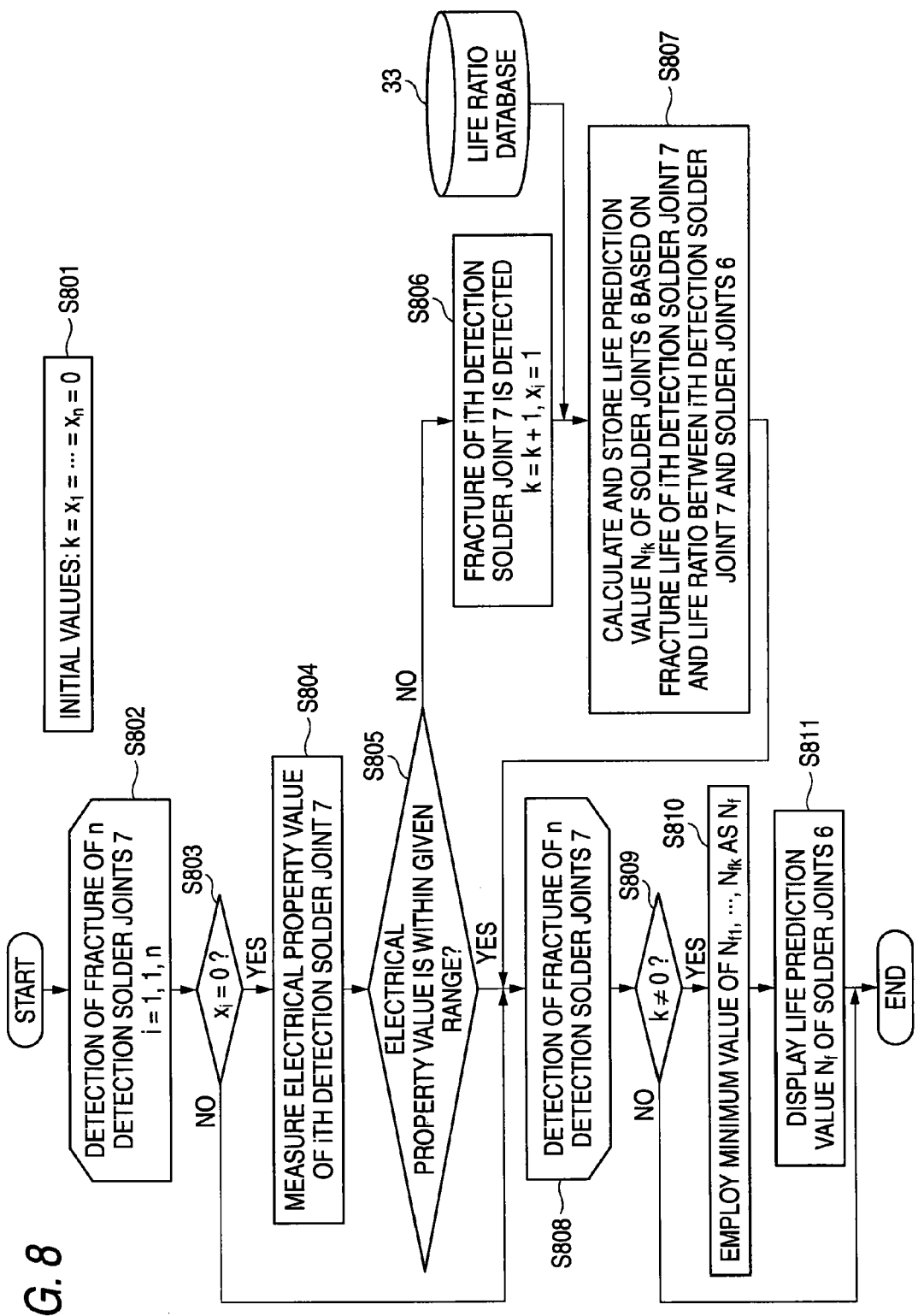
FIG. 8 is a flowchart of a method for predicting a damage index of solder joints of an electronic component according to a third modification.

Next, a third modification of the first embodiment will be described. FIG. 8 is a flowchart of a method for predicting a damage index of the solder joints 6. As seen from FIG. 8, the damage index predicting method according to the third modification is the same as that according to the second modification of the first embodiment except that the minimum value of plural life prediction values that are calculated from fracture lives of plural detection solder joints 7 is determined as a life prediction value of the solder joints 6. To detect fracture of n-pieces of detection solder joints 7, electrical property values of the n respective detection solder joints 7 are measured at steps S802-S808. If fracture of a detection solder joint 7 is detected at step S806, at step S807 a life prediction value $N_{fk}$ of the solder joints 6 is calculated based on an actual fracture life of the fracture-detected detection solder joint 7 and data of the life ratio between the fractured detection solder joint 7 and the solder joints 6 (taken in from the database 33). The minimum value of $N_{f1}$ to $N_{fk}$ is employed as a life prediction value $N_f$ of the solder joints 6 at step S810, and is displayed as a corrected life prediction value at step S811. From this time onward, every time a new detection solder joint 7 is fractured, the life prediction value $N_f$ of the solder joints 6 is corrected by determining the minimum value of life prediction values of the solder joints 6 that are calculated from fracture lives of the detection solder joints 7 fractured so far and life ratios between the fractured detection solder joints 7 and the solder joints 6.

The third modification enables safer damage index prediction because the minimum life data among plural fracture life data is reflected.

The method for determining a life prediction value of the solder joints 6 from plural life prediction values of the solder joints 6 that are calculated based on fracture lives of plural detection solder joints 7 is not limited to the above. For example, a median of the plural life prediction values or a life prediction value that is calculated from a fracture life of the last-fractured detection solder joint 7 may be employed. The fracture life of the last-fractured detection solder joint 7 reflects a use history of the electronic device from the start of use to a time point of occurrence of the last fracture. Therefore, the prediction based on a fracture life of a detection solder joints 7 that is fractured last makes it possible to correct the damage index prediction value stepwise in such a manner that the use history is reflected more properly.

Although in the third modification the fracture life is used as the damage-related index, the damage value, which was used in the first modification, may be used instead.

Figure 9:
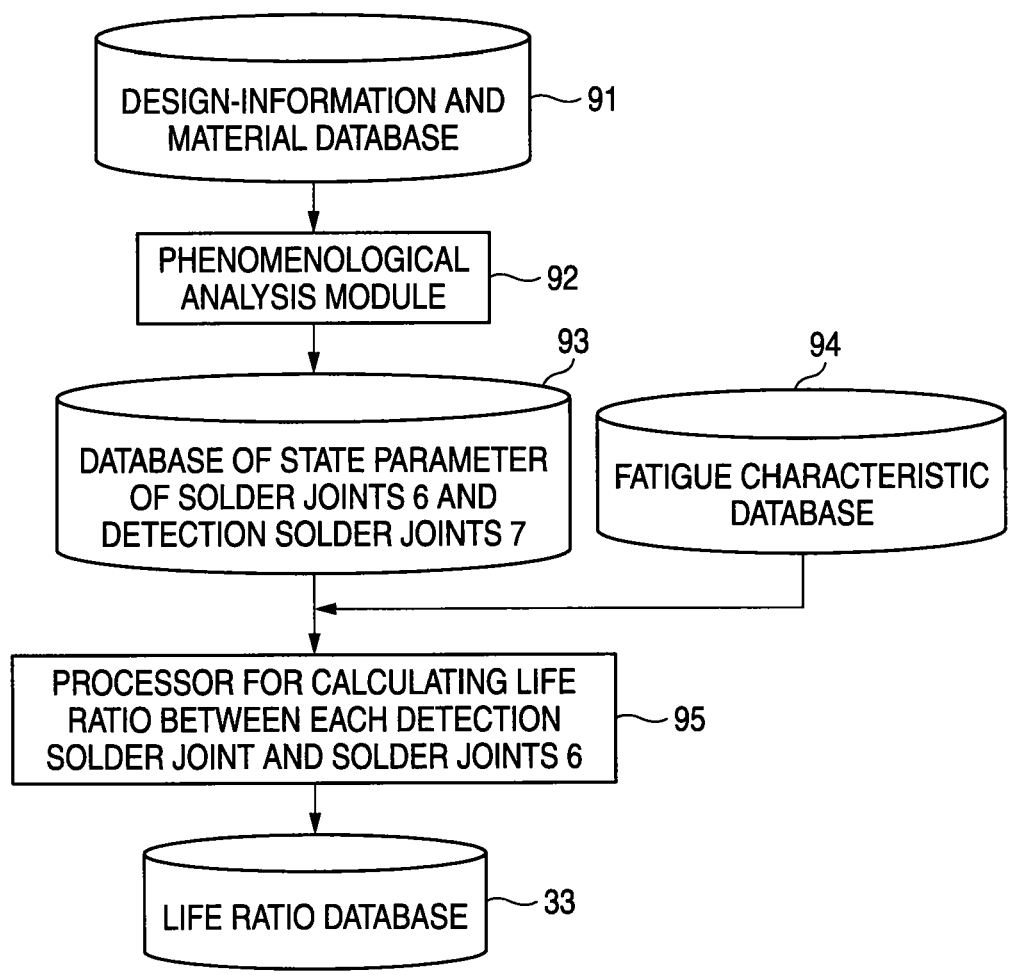
FIG. 9 is a block diagram outlining a configuration for constructing a database of the life ratio between detection solder joints and solder joints of an electronic component by phenomenological analysis according to a fourth modification.

Next, a fourth modification will be described in which the method for constructing a database of the life ratio between the detection solder joints 7 and the solder joints 6 is changed. FIG. 9 is a block diagram outlining a configuration for constructing a database of the life ratio between the detection solder joints 7 and the solder joints 6 by phenomenological analysis such as FEM analysis in the case where the damage-related index is the fracture life and the relationship between the damage-related indices is the life ratio. There are provided a design-information and material database 91, a phenomenological analysis module 92, a database 93 of a state parameter of the solder joints 6 and the detection solder joints 7, a fatigue characteristic database 94, a processor 95 for calculating a life ratio between each detection solder joint 7 and the solder joints 6, and a database 33 of the life ratio between the detection solder joints 7 and the solder joints 6. Information necessary for a phenomenological analysis such as sizes and an arrangement of components and material property values of the respective components are accumulated in the design-information and material database 91 in advance. The phenomenological analysis module 92 performs a phenomenological analysis simulating a use situation of the electronic device based on the design information and the material information of the database 91, calculates state parameter values of the solder joints 6 of the electronic component 2 and the detection solder joints 7, and stores them in the database 93 in advance. Where the state parameter is a strain range of a solder joint, the processor 95 calculates a life ratio between each detection solder joint 7 and the solder joints 6 using data of strain ranges occurring in the solder joints 6 of the electronic component 2 and the detection solder joint 7 (stored in the database 93) and data representing a relationship between the strain range and the life of the solder joints (stored in the fatigue characteristic database 94) and stores the calculated life ratio in the database 33.

The fourth modification makes it possible to construct a database of the life ratio of the detection solder joints 7 and the solder joints 6 easily in a relatively short time without using any instrument for an experiment.

Figure 10:
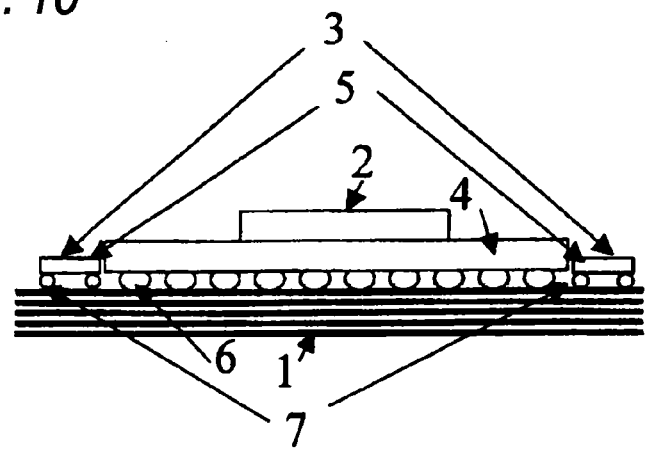
FIG. 10 is a sectional view of an electronic device and its neighborhood according to a fifth modification.

Next, a fifth modification will be described in which the arrangement of the detection devices 3 to be used for predicting a damage-related index the solder joints 6 that electrically connect the electronic device 2 to the circuit board 1 is changed. FIG. 10 is a sectional view of an electronic device 2 and its neighborhood according to the fifth modification. As shown in FIG. 10, an electronic component 2 is mounted on a circuit board 1 and plural detection devices 3 are mounted on the same surface of the circuit board 1 as the electronic device 2 in the vicinity of the electronic device 2. The plural detection devices 3 are electrically connected to the circuit board 1 by detection solder joints 7. The detection solder joints 7 are designed so that their lives are shorter than the life of the solder joints 6 and are different from each other. The fifth modification can reduce the thickness of the entire electronic device because the detection devices 3 are mounted on the same surface of the circuit board 1 as the electronic device 2. Furthermore, the fifth medication enables even higher accuracy damage index prediction by using stepwise damage-related indices of the detection solder joints 7 of the plural detection devices 3.

Figure 11A:
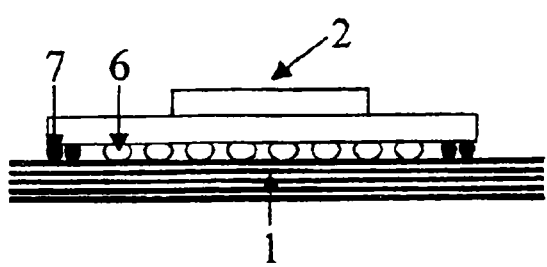
FIG. 11A is a sectional view showing an electronic component and its neighborhood according to a sixth modification.

Next, a sixth modification will be described as another modification in which the arrangement of the detection solder joints 7 to be used for predicting a life of the solder joints 6 is changed. FIG. 11A is a sectional view showing an electronic component 2 and its neighborhood according to the sixth modification, and FIG. 11B is a plan view showing an arrangement of solder joints 6 of the electronic component 2 and detection solder joints 7.

Figure 11B:
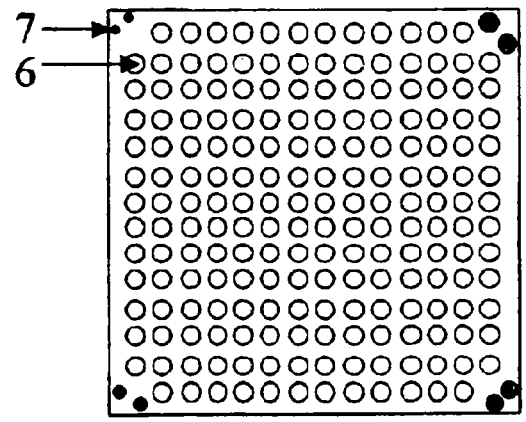
FIG. 11B is a plan view showing an arrangement of solder joints of the electronic component and detection solder joints.

As shown in FIGS. 11A and 11B, the electronic device 2 and a package substrate 4 constitute a BGA semiconductor package, which is mounted on a circuit board 1. Solder joints 6 that electrically connect the electronic component 2 to the circuit board 1 are disposed between the circuit board 1 and the package substrate 4 and arranged in matrix form detection solder joints 7 to be used for predicting a life of the solder joints 6 are disposed at the package corners. Two detection solder joints 7 constitute a set and are incorporated in a single circuit. Fracture of one or both of the detection solder joints 7 can be detected by monitoring an electrical property value of the associated circuit.

The detection solder joints 7 are designed so that their lives are shorter than the life of the solder joints 6 and are different from each other. In the sixth modification of FIGS. 11A and 11B, the detection solder joints 7 are disposed at the package corners where in general the curvature of the circuit board 1 has a large variation and heavy loads are imposed on the solder joints. Furthermore, the detection solder joints 7 are made smaller in diameter than the solder joints 6. Thus, the detection solder joints 7 have shorter lives than the solder joints 6. The lives of the sets of detection solder joints 7 can be made different from each other by changing the sizes of the detection solder joints 7 for each set.

The sixth modification can reduce the external size of the semiconductor package including the detection solder joints 7.

Figure 12A:
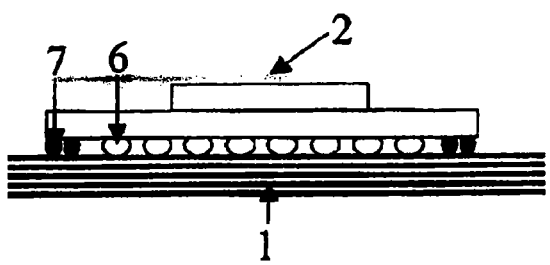
FIG. 12A is a sectional view showing an electronic component and its neighborhood according to a seventh modification.
Figure 12B:
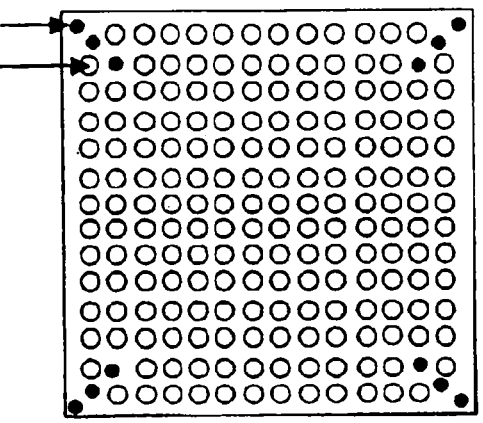
FIG. 12B is a plan view showing an arrangement of solder joints of the electronic component and detection solder joints.

Another modification to the arrangement etc. of the detection solder joints 7 is possible. FIG. 12A is a sectional view showing an electronic component 2 and its neighborhood according to a seventh modification, and FIG. 12B is a plan view showing an arrangement of solder joints 6 of the electronic component 2 and detection solder joints 7. As shown in FIGS. 12A and 12B, the detection solder joints 7 are made smaller in diameter than the solder joints 6 so as to have shorter lives than the solder joints 6. In general, the curvature of the circuit board 1 has a large variation at the package corners and heavy loads are imposed on the solder joints there. In view of this, in the seventh modification, the detection solder joints 7 of each set are arranged so as to have different distances from the associated package corner and to thereby have different lives.

The seventh modification makes it possible to secure a high degree of freedom of layout designing on the package substrate 4.

A further modification to the arrangement etc. of the detection solder joints 7 is possible. FIG. 13A is a sectional view showing an electronic component 2 and its neighborhood according to an eighth modification, and FIG. 13B is a plan view showing an arrangement of solder joints 6 of the electronic component 2 and detection solder joints 7. Also in the eighth modification, the detection solder joints 7 are designed so that their lives are shorter than the life of the solder joints 6 and are different from each other. In the eighth modification, the detection solder joints 7 are disposed at the package corners where in general heavy loads are imposed on the solder joints. Furthermore, the detection solder joints 7 are made smaller in diameter than the solder joints 6. Thus, the detection solder joints 7 have shorter lives than the solder joints 6. In general, the circuit board 1 is deformed more around a fixing member 8 for fixing the circuit board 1 than in the other areas. Therefore, the lives of the respective sets of detection solder joints 7 can be different from each other by disposing the sets of detection solder joints 7 at positions having different distances from the fixing member 8.

The eighth modification also makes it possible to secure a high degree of freedom of layout designing on the package substrate 4.

Second Embodiment

Next, a second embodiment of the invention will be described.

Figure 14:
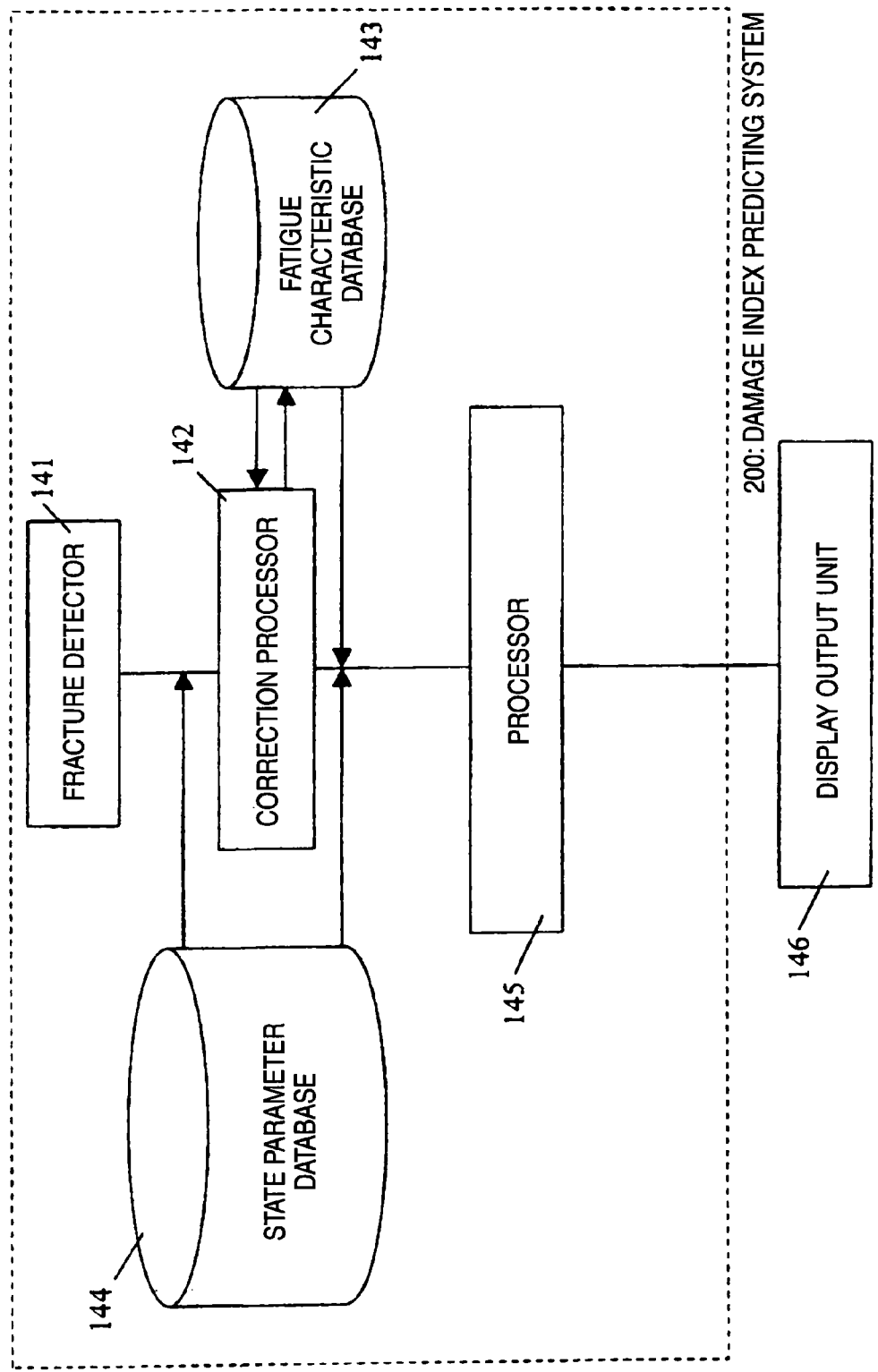
FIG. 14 is a block diagram showing a general configuration of a damage index predicting system according to a second embodiment of the invention.

The second embodiment utilizes phenomenological analysis or the like which simulates a use situation of an electronic device in predicting a damage index of solder joints of an electronic component. FIG. 14 is a block diagram showing a general configuration of a damage index predicting system according to the second embodiment. This damage index predicting system can either be incorporated in an electronic device or be provided outside an electronic device and connected to it. As shown in FIG. 14, the damage index predicting system 200 is equipped with a fracture detector 141 for detecting fracture of a detection solder joint 7, a fatigue characteristic database 143, a correction processor 142 for correcting the fatigue characteristic database 143, a state parameter database 144 in which data of a state parameter of solder joints 6 and the detection solder joint 7 are accumulated, a processor 145 for calculating a prediction value of a damage-related index of the solder joints 6, and a display output unit 146. The display output unit 146 may be omitted.

The fracture detector 141 serves to detect fracture of the detection solder joint 7. Data of a state parameter, such as temperature, load, stress, displacement, or strain, of the solder joints 6 and the detection solder joint 7 are accumulated in the state parameter database 144 in advance. When receiving fracture detection information of the detection solder joint 7 from the fracture detector 141, the correction processor 142 corrects the fatigue characteristic database 143 (described later in detail) based on data of the damage-related index of the of the detection solder joint 7 and data of the state parameter of the detection solder joint 7 that is taken in from the state parameter database 144. Fatigue characteristic data indicating a relationship between the state parameter and the damage-related index of the solder joints 6 are accumulated in the fatigue characteristic database 143. The processor 145 retrieves data of the state parameter of the detection solder joint 7 and the solder joints 6 from the state parameter database 144 and also retrieves fatigue characteristic data indicating a relationship between the state parameter and the damage-related index of the solder joints 6 from the fatigue characteristic database 143, and calculates a prediction value of the damage-related index of the solder joints 6. Where the display output unit 146 is provided, the calculated prediction value of the damage-related index of the solder joints 6 may be displayed thereon. In this manner, more reliable damage index prediction than original prediction is enabled.

Figure 15:
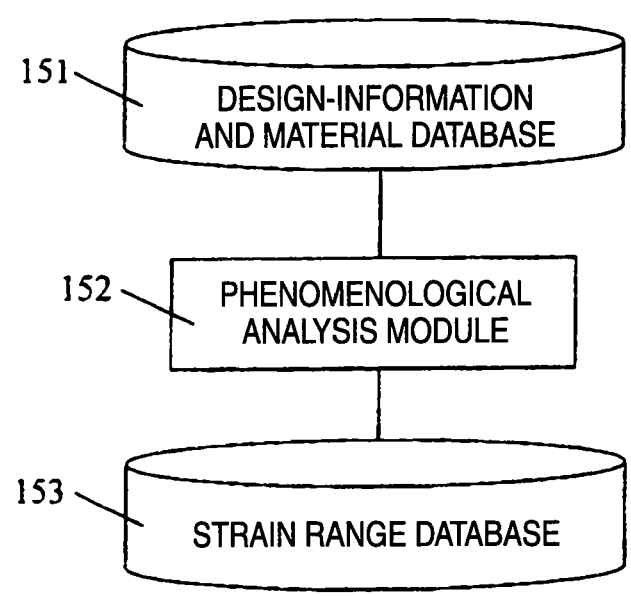
FIG. 15 is a block diagram outlining a configuration for constructing a strain range database of solder joints and a detection solder joint by phenomenological analysis.

FIG. 15 is a block diagram outlining a configuration according to the second embodiment for constructing a state parameter database of a strain range of the solder joints 6 and the detection solder joint 7 by phenomenological analysis such as FEM analysis in the case where the state parameter of a solder joint is a strain range of a solder joint and the damage-related index of a solder joint is the fracture life.

There are provided design-information and material database 151, a phenomenological analysis module 152, and a database (state parameter database) 153 of the strain range of the solder joints 6 and the detection solder joint 7. Information necessary for a phenomenological analysis such as sizes and an arrangement of components and material property values of the respective components are accumulated in the design-information and material database 151 in advance. The phenomenological analysis module 152 retrieves the information necessary for a phenomenological analysis from the database 151 and calculates strain ranges of the respective solder joints by performing, for example, a phenomenological analysis such as an FEM analysis simulating a use environment or an accelerated test.

Figure 16:
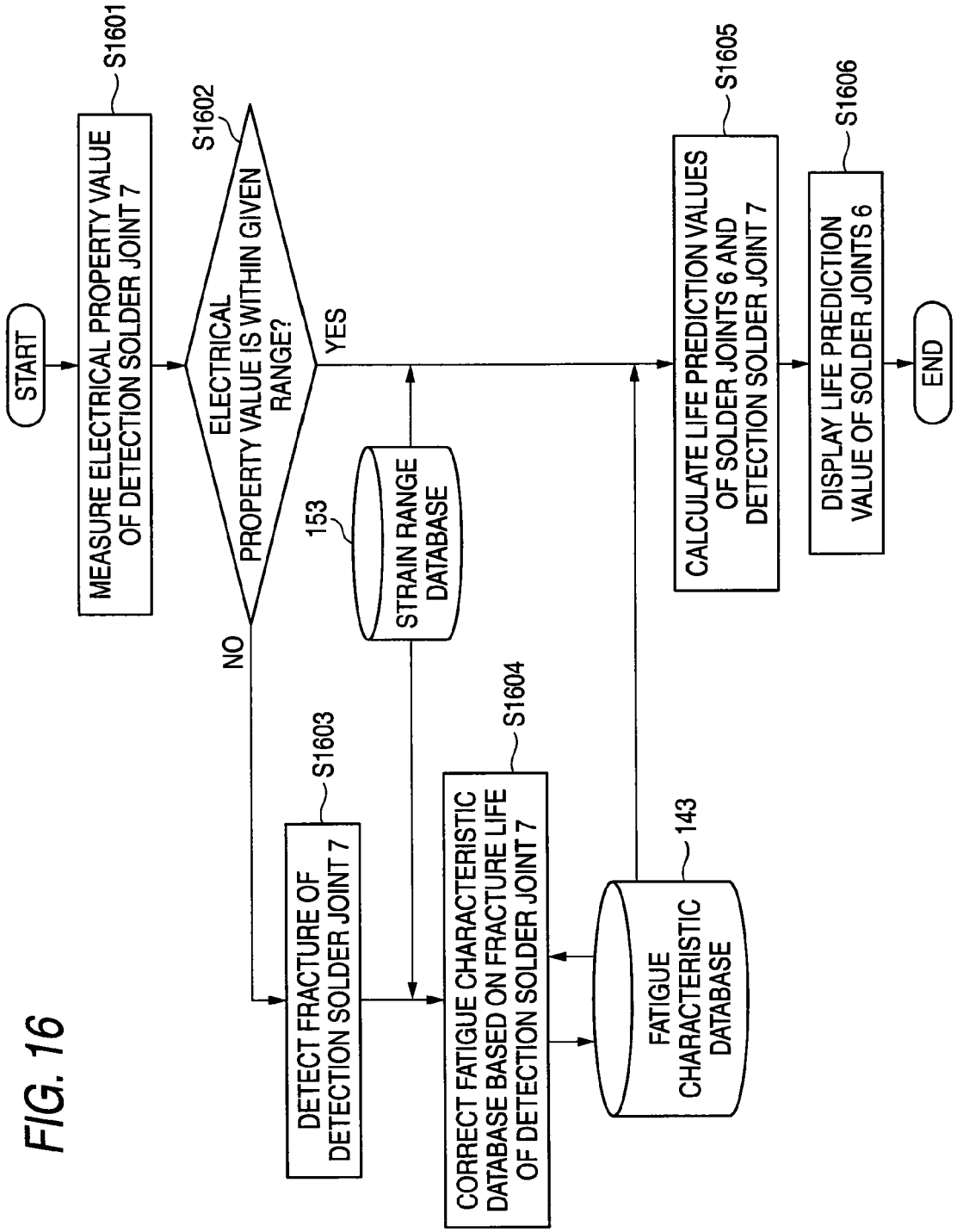
FIG. 16 is a flowchart of a method for predicting a life of solder joints of an electronic component according to the second embodiment.

FIG. 16 is a flowchart of a method for predicting a life of the solder joints 6 of the electronic component 2 according to the second embodiment. It is assumed that the database 153 of the strain range of the solder joints 6 and the detection solder joint 7 shown in FIG. 15 is used as a state parameter database.

At step S1601, an electrical property value of a detection solder joint 7 is measured. If the electrical property value of the detection solder joint 7 is out of a given range (S1602: no), its fracture is detected at step S1603. Examples of the electrical property are electrical resistance and capacitance. If fracture of the detection solder joint 7 is detected at step S1603, at step S1604 the fatigue characteristic database 143 is corrected based on an actual fracture life of the detection solder joint 7 and strain range data that is taken in from the database 153. A correcting method will be described later in detail. At step S1605, stain range data of the solder joints 6 is taken in from the database 153 and data of a relationship between the strain range and the life of the solder joints 6 is taken in from the fatigue characteristic database 143, and life prediction values of the solder joints 6 and the detection solder joint 7 are calculated. At step S1606, the life prediction value of the solder joints 6 is displayed.

The second embodiment provides, in addition to the same advantages as the first embodiment does, an advantage that even higher accuracy damage prediction is enabled by correcting the pre-build fatigue characteristic database 143 according to a use situation.

Although in the embodiment only one detection solder joint 7 is provided, plural detection solder joints 7 may be provided, in which case more accurate damage index prediction is enabled.

Figure 17:
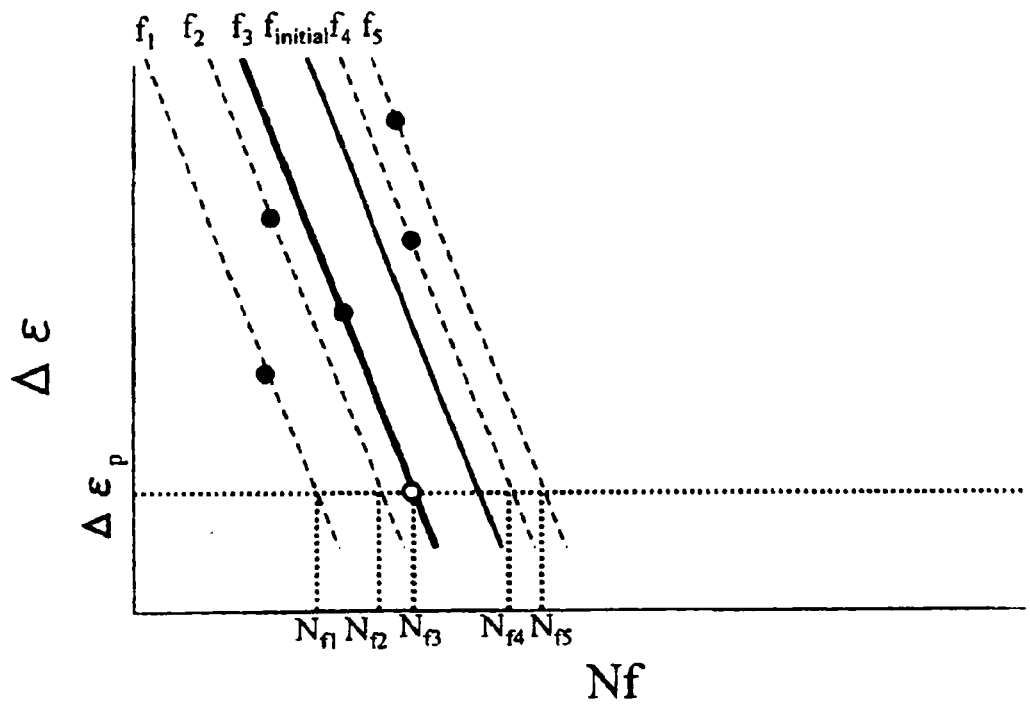
FIG. 17 is a schematic graph showing a fatigue characteristic database correcting method.

FIG. 17 is a schematic graph showing a method for correcting the fatigue characteristic database 143. It is assumed that the state parameter is a strain range $\Delta\epsilon$ of a solder joint and the damage-related index is a fracture life cycle number $N_f$, and that data of the fatigue characteristic database 143 is a relationship between the strain range $\Delta\epsilon$ and the fracture life cycle number $N_f$. In FIG. 17, the vertical axis represents the strain range $\Delta\epsilon$ of a solder joint and the horizontal axis represents the prediction value of the fracture life cycle number $N_f$. Each black dot represents data that is a combination of a strain range $\Delta\epsilon$ predicted from a phenomenological analysis result, information relating to the state of the circuit board 1, and other information and an actual fracture life cycle number $N_f$ of a fractured detection solder joint 7. For example, a fatigue characteristic of a general metal material follows Coffin-Manson's law in the case of low-cycle fatigue and follows Baskin's law in the case of high-cycle fatigue. Where consideration is given to both of low-cycle fatigue and high-cycle fatigue, a fatigue characteristic of a general metal material follows a combination of the Coffin-Manson's law and the Baskin's law. In the embodiment, it is assumed that the fatigue characteristic database 143 has an equation correlating the strain range and the fracture life that is represented by a single straight line as in the graph of FIG. 17. In FIG. 17, symbol $f_{initial}$ denotes a straight line representing fatigue characteristic data obtained at the time of designing of the electronic device.

The straight line $f_{initial}$ is translated in the horizontal direction for all points each representing a combination of a strain range $\Delta\epsilon$ and a fracture life cycle number $N_f$ of a fractured detection solder joint 7 so that each point is located on a straight line representing a relationship between the strain range $\Delta\epsilon$ and the fracture life cycle number $N_f$, whereby straight lines $f_1$ to $f_n$ are obtained in the number of points. Statistical processing is performed on fracture life prediction values $N_{f1}$ to $N_{fn}$ of the solder joints 6 that are estimated from a current prediction strain range $\Delta\epsilon_p$ of the solder joints 6 and the n-pieces of straight lines $f_1$ to $f_n$ thus produced. A fracture life prediction value $N_f$ of the solder joints 6 is calculated, and the straight line representing the relationship between the strain range $\Delta\epsilon$ and the fracture life cycle number $N_f$ is translated so that the fracture life prediction value becomes $N_f$ when the strain range is equal to $\Delta\epsilon_p$. The fatigue characteristic database 143 is thus corrected.

As for the statistical processing, where the fracture life prediction values $N_{f1}$ to $N_{fn}$ have a logarithmic normal distribution, it is appropriate to employ their average as a fracture life prediction value $N_f$. Where the fracture life prediction values $N_{f1}$ to $N_{fn}$ have a Weibull distribution, it is appropriate to employ their median as a fracture life prediction value $N_f$. The example of FIG. 17 is such that the median $N_{f3}$ of $N_{f1}$ to $N_{fn}$ is employed as a fracture life prediction value $N_f$ (i.e., $N_f=N_{f3}$). The straight line of the fatigue characteristic database becomes $f_3$. Although in the above description the damage index prediction straight line is translated in the horizontal direction in the graph of FIG. 17, it may be translated in the vertical direction for a certain case.

Figure 18:
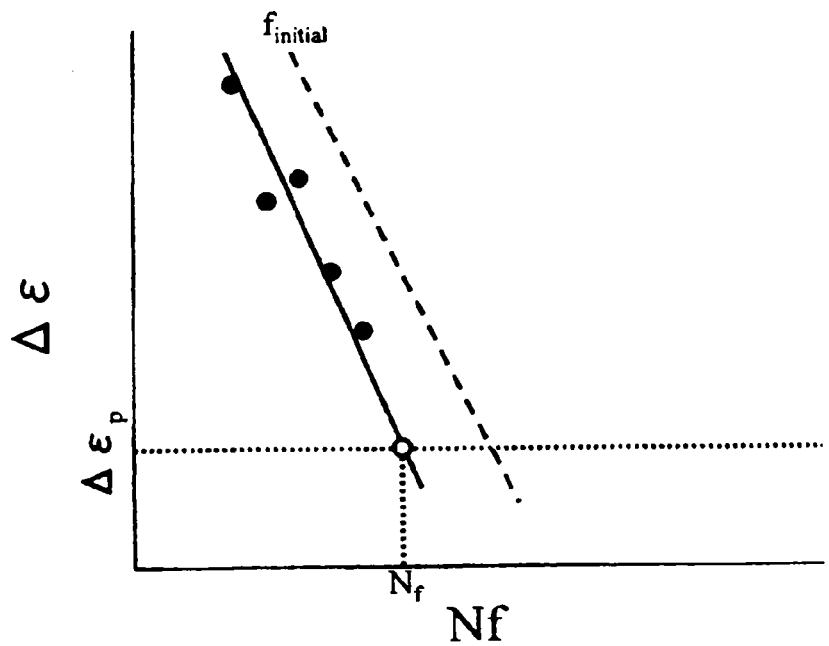
FIG. 18 is a schematic graph showing a modified fatigue characteristic database correcting method.

Next, a modified method for correcting the fatigue characteristic database 143 will be described. Also in this modified method, the damage index prediction database is represented by a straight line. FIG. 18 is a schematic graph showing a modified method for correcting the fatigue characteristic database 143.

It is assumed that the state parameter is a strain range $\Delta\epsilon$ of a solder joint and the damage-related index is a fracture life cycle number $N_f$, and that data of the fatigue characteristic database 143 is a relationship between the strain range $\Delta\epsilon$ and the fracture life cycle number $N_f$. In FIG. 18, a single straight line $f_{initial}$ represents, for example, fatigue characteristic data obtained at the time of designing of the electronic device. A straight line f is determined from points (black dots) each representing a combination of a strain range $\Delta\epsilon$ and an actual fracture life $N_f$ of a fractured detection solder joint 7 according to the least squares method, and a life prediction value $N_f$ of the solder joints 6 is calculated from a current prediction strain range $\Delta\epsilon_p$ and the straight line f. Every time fracture of a detection solder joint 7 is newly detected, the data of strain ranges $\Delta\epsilon$ and fracture life cycle numbers $N_f$ are expanded and the straight line f is changed. The fatigue characteristic database 143 is thus corrected.

Figure 19:
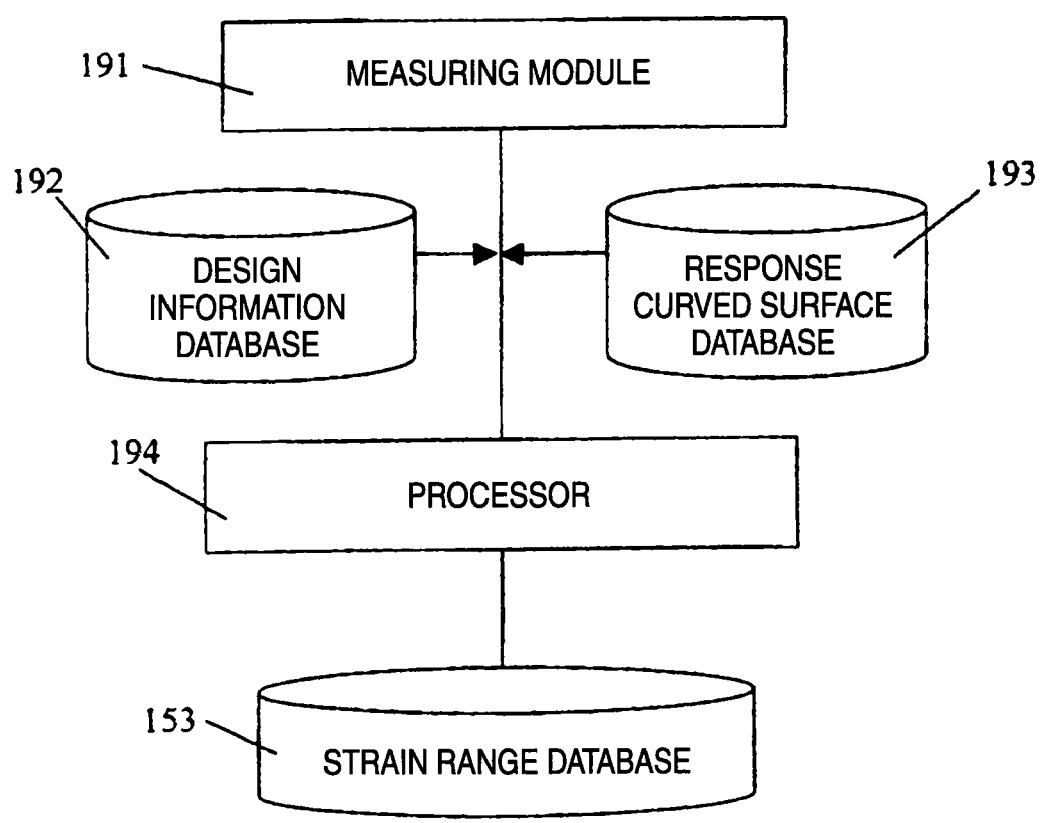
FIG. 19 is a block diagram outlining a configuration for constructing a database of strain ranges of solder joints and a detection solder joint according to a modification of the second embodiment.

Next, a modification of the second embodiment of the invention will be described. In this modification, information relating to a state to be measured during use of the electronic device is used in predicting a damage index of the solder joints 6 of the electronic component 2. FIG. 19 is a block diagram outlining a configuration for constructing a strain range database 153 of the solder joints 6 and the detection solder joint 7 according to the modification. This modification is the same as the second embodiment except the method for constructing a strain range database 153 of the solder joints 6 and the detection solder joint 7. As shown in FIG. 19, there are provided a measuring module 191 for measuring information relating a state of the circuit board 1, a design information database 192, a response curved surface database 193, a processor 194 for calculating strain range values of the solder joints 6 and the detection solder joint 7, and a strain range database 153 of the solder joints 6 and the detection solder joint 7. Data are accumulated in the database 153 in real time during use of the electronic device. For example, the measuring module 191 measures temperature, strain, stress, electrical resistance, or the like of the circuit board 1. For example, sizes and an arrangement of components and other information are accumulated in the design information database 192 in advance. The response curved surface database 193 is stored with response curved surface data to be used for calculating a strain range of each solder joint based on the information relating to the state of the circuit board 1 and the design information. The processor 194 retrieves the information relating to the state of the circuit board 1 from the measuring module 191, retrieves the design information from the design information database 192, and retrieves the response curved surface data representing a relationship between the information relating to the state of the circuit board 1, the design information, and the strain ranges of the respective solder joints. And the processor 194 calculates strain range values of the solder joints 6 and the detection solder joint 7 and stores them in the database 153. In this manner, more reliable life prediction than original prediction is enabled.

The strain range occurring in each solder joint of an electronic device varies at each time of use because of variations in use time, use environment, etc. In view of this, varied strain ranges obtained as the electronic device is used repeatedly are converted into a repetition of a constant strain range $\Delta\epsilon_{eq}$ (referred to as cumulative equivalent strain range) so that accumulated damage remains the same. In the modification, fatigue characteristic data of the fatigue characteristic database 143 is an equation representing a relationship between the cumulative equivalent strain range $\Delta\epsilon_{eq}$ and the fracture life of the solder joints 6, and a life prediction value is calculated according to the equation representing the relationship between the cumulative equivalent strain range $\Delta\epsilon_{eq}$ and the fracture life of the solder joints 6.

The modification makes it possible to predict, with high accuracy, a damage index of the solder joints 6 which reflects a use history more properly because damage index prediction is performed in real time based on data measured during use and the database that is used for the damage index prediction is updated successively.

The invention is not limited to the above embodiments themselves and, in the practice stage, may be embodied in such a manner that constituent elements are modified without departing from the spirit and scope of the invention. And various inventions can be conceived by properly combining plural constituent elements disclosed in each embodiment. For example, several ones of the constituent elements of each embodiment may be omitted. Furthermore, constituent elements of the different embodiments may be combined as appropriate.

As described in the above, there is provided a system capable of performing highly accurate damage index prediction in which an environment and a use situation of an electronic device and differences between individual apparatus are taken into consideration by predicting a life of solder joints of an electronic component based on a damage index of a detection solder joint during use of the electronic device.

It is to be understood that the invention is not limited to the specific embodiments described above and that the invention can be embodied with the components modified without departing from the spirit and scope of the invention. The invention can be embodied in various forms according to appropriate combinations of the components disclosed in the embodiments described above. For example, some components may be deleted from the configurations described as the embodiments. Further, the components described in different embodiments may be used appropriately in combination.

What is claimed is:

1. A fracture life predicting system for predicting a fracture life of solder joints of an electronic device having the solder joints that electrically connect an electronic component to a mounting circuit board, the system comprising:
   a fracture detector comprising a plurality of detection solder joints that are designed so as to have a shorter life than the solder joints, the plurality of detection solder joints mounted on a surface of the mounting circuit board so that no electrical signals for functioning of the electronic component pass through the plurality of detection solder joints, the surface being between the mounting circuit board and the electronic component, the fracture detector configured to detect fracture of each of the plurality of detection solder joints and obtain a fracture life of each detection solder joint at a time point when the detection solder joint is fractured;
   a state parameter database configured to store data of a state parameter of the solder joints and each of the plurality of detection solder joints;
   a fatigue characteristic database configured to store fatigue characteristic data indicating a relationship between the state parameter of the solder joints and the fracture life of the solder joints;
   a correction processor configured to receive fracture detection information of each of the plurality of detection solder joints from the fracture detector and to correct the fatigue characteristic data of the solder joints stored in the fatigue characteristic database by shifting a line representing a relationship between a value of the fracture life and a value of the state parameter of each of the plurality of detection solder joints with a constant slope; and
   a processor configured to receive the data of the state parameter of the solder joints and the plurality of detection solder joints from the state parameter database and the corrected fatigue characteristic data from the fatigue characteristic database and to calculate a prediction value of the fracture life of each of the solder joints,
   wherein the detection solder joints are disposed in a position more towards a corner of the mounting circuit board than the solder joints, and
   wherein the detection solder joints are arranged so as to have different distances from the corner.

2. The system of claim 1 further comprising a display output unit configured to display the prediction value of the damage-related index of the solder joints calculated by the processor.

3. The system of claim 1, wherein the state parameter database is configured to store data of at least one of temperature, load, stress, displacement, and strain.

4. The system of claim 1 further comprising a design-information and material database configured to store design information and material information relating to the electronic component,
   wherein the state parameter of the solder joints comprises a strain range value of the solder joints, and
   wherein the state parameter database is configured to store data of the strain range of the solder joints obtained by receiving necessary information from the design-information and material database and performing a phenomenological analysis.

5. The system of claim 1, wherein the state parameter comprises a strain range value, and wherein the correction processor is configured to correct the fatigue characteristic data in accordance with the strain range value of the solder joints predicted from a result of a phenomenological analysis and information relating to a state of the circuit board and an actually obtained value of the fracture life of the solder joints.

6. The system of claim 1 further comprising:
   a measuring module configured to measure information relating to a state of the circuit board;

a design information database configured to store design information relating to the electronic component;

a response curved surface database configured to store response curved surface data to be used for calculating a strain range value of the solder joints based on the information relating to the circuit board measured by the measuring module and the design information relating to the electronic component; and a strain range processor configured to retrieve the information relating to the circuit board, the design information, and the response curved surface data from the measuring module, the design information database, and the response curved surface database, respectively, and calculate strain range values of the solder joints and the detection solder joints, wherein the state parameter database is configured to store data of strain range values calculated by the strain range processor in real time during use of the electronic device.

7. The system of claim 6, wherein the information relating to the state of the circuit board comprises at least one of temperature, strain, stress, acceleration, and electrical resistance.

8. The system of claim 7, wherein materials of the circuit board, and a package substrate of the electronic component are selected so that linear expansion coefficients of the circuit board and the package substrate of the electronic component increase in this order.

9. The system of claim 1, wherein the detection solder joints are smaller in diameter than the solder joints.

10. The system of claim 1, wherein the detection solder joints are disposed in a set and are incorporated in a single circuit.

11. The system of claim 1, wherein the correction processor is configured to calculate an average of values of the fracture life and to correct the fatigue characteristic data with the average every time one of the detection solder joints is fractured.

12. The system of claim 1, wherein the correction processor is configured to employ, as a life prediction value of the solder joints, a smallest one of life prediction values every time one of the detection solder joints is fractured.

13. The system of claim 1, wherein the fatigue characteristic database stores a life ratio between a fracture life of the detection solder joints and a fracture life of the solder joints, and wherein the processor calculate the prediction value based on the fracture life of each of the detection solder joints obtained by the fracture detector at the time point when the detection solder joint is fractured and the life ratio stored in the fatigue characteristic database.

14. A method for predicting a of solder joints of an electronic device having the solder joints that electrically connect an electronic component to a mounting circuit board, the method comprising:

storing, in a state parameter database, data of a state parameter of the solder joints and each of a plurality of detection solder joints;

storing, in a fatigue characteristic database, fatigue characteristics data indicating a relationship between the state parameter of the solder points and the fracture life of the solder joints;

detecting, via a fracture detector comprising detection solder joints that are designed so as to have a shorter life than the solder joints, and are mounted on a surface of the mounting circuit board, the surface being between the mounting circuit board and the electronic component, fracture of the detection solder joints, and obtaining a fracture life of each detection solder joint at a time point when the detection solder joint is fractured;

receiving, at a correction processor, fracture detection information of each of the plurality of detection solder joints from the fracture detector;

correcting, by the correction processor, the fatigue characteristic data of the solder joints stored in the fatigue characteristic database by shifting a line representing a relationship between a value of the fracture life and a value of the state parameter of each of the plurality of detection solder joints with a constant slope;

receiving, at a processor, the data of the state parameter of the solder joints and the plurality of detection solder joints from the state parameter database and the corrected fatigue characteristics data from the fatigue characteristic database; and calculating, by the processor, a prediction value of the fracture life of each one of the solder joints, wherein the detecting step further comprises detecting, via the fracture detector that further comprises the detection solder joints that are disposed in a position more towards a corner of the mounting circuit board than the solder joints and that are arranged so as to have different distances from the corner.

15. The method of claim 14, wherein the detecting step further comprises detecting, via the fracture detector comprising detection solder joints that are smaller in diameter than the solder joints.

16. The method of claim 14, wherein the detecting step further comprises detecting, via the fracture detector that further comprises the detection solder joints that are disposed in a set and are incorporated in a single circuit.

17. A fracture life predicting system for predicting a fracture life of solder joints of an electronic device having the solder joints that electrically connect an electronic component to a mounting circuit board, the system comprising:

a fracture detector comprising a detection solder joint that is designed so as to have a shorter life than the solder joints, the detection solder joint mounted on a surface of the mounting circuit board, the surface being between the mounting circuit board and the electronic component, the fracture detector configured to detect fracture of the detection solder joint and obtain a fracture life of the detection solder joint at a time point when the detection solder joint is fractured;

a state parameter database configured to store data of a state parameter of the solder joints and the detection solder joint;

a fatigue characteristic database configured to store fatigue characteristic data indicating a relationship between the state parameter of the solder joints and the fracture life of the solder joints;

a correction processor configured to receive fracture detection information of the detection solder joint from the fracture detector and to correct the fatigue characteristic data of the solder joints stored in the fatigue characteristic database by shifting a line representing a relationship between a value of the fracture life of the detection solder joint and a value of the state parameter of the detection solder joint with a constant slope; and a processor configured to receive the data of the state parameter of the solder joints and the detection solder joint from the state parameter database and the corrected fatigue characteristic data from the fatigue characteristic database and to calculate a prediction value of the fracture life of each of the solder joints.

* * * * *